United States Patent
Vanderzon

(10) Patent No.: US 8,729,875 B2
(45) Date of Patent: May 20, 2014

(54) CURRENT ZERO CROSSING DETECTOR IN A DIMMER CIRCUIT

(75) Inventor: James Robert Vanderzon, Bowden (AU)

(73) Assignee: Clipsal Australia Pty Ltd, South Australia (AU)

( * ) Notice: Subject to any disclaimer, the term of this patent is extended or adjusted under 35 U.S.C. 154(b) by 1312 days.

(21) Appl. No.: 12/096,916

(22) PCT Filed: Dec. 12, 2006

(86) PCT No.: PCT/AU2006/001883
§ 371 (c)(1),
(2), (4) Date: Nov. 3, 2008

(87) PCT Pub. No.: WO2007/068042
PCT Pub. Date: Jun. 21, 2007

(65) Prior Publication Data
US 2009/0167265 A1    Jul. 2, 2009

(30) Foreign Application Priority Data

Dec. 12, 2005   (AU) ................................ 2005906950

(51) Int. Cl.
*G05F 1/00*    (2006.01)
(52) U.S. Cl.
USPC ........................................................ 323/274
(58) Field of Classification Search
USPC .......... 323/273–281, 235, 193, 282, 284–285
See application file for complete search history.

(56) References Cited

U.S. PATENT DOCUMENTS

| | | | | |
|---|---|---|---|---|
| 4,240,070 A * | 12/1980 | Helbig et al. | ................. | 341/139 |
| 4,466,071 A | 8/1984 | Russell, Jr. | | |
| 4,720,667 A * | 1/1988 | Lee et al. | ...................... | 323/271 |
| 4,760,293 A * | 7/1988 | Hebenstreit | ................... | 327/432 |
| 5,682,149 A * | 10/1997 | Hofman | .................. | 340/870.17 |
| 6,606,259 B2 * | 8/2003 | Cohen | ........................ | 363/56.01 |
| 2001/0048296 A1* | 12/2001 | Halberstadt | ................... | 323/312 |
| 2003/0006228 A1* | 1/2003 | Nagatomo | .................... | 219/494 |
| 2003/0160579 A1* | 8/2003 | Amith et al. | ................... | 315/291 |
| 2004/0095021 A1* | 5/2004 | Fogleman et al. | ............... | 307/52 |
| 2004/0125627 A1* | 7/2004 | Nadd et al. | ..................... | 363/125 |
| 2004/0217752 A1* | 11/2004 | Yang | .............................. | 323/363 |

FOREIGN PATENT DOCUMENTS

WO     2006/023938 A2    3/2006

OTHER PUBLICATIONS

U.S. Appl. No. 12/096,923 to Vanderzon, filed on Jun. 11, 2008.
U.S. Appl. No. 12/096,913 to Vanderzon, filed on Jun. 11, 2008.

* cited by examiner

*Primary Examiner* — Adolf Berhane
*Assistant Examiner* — Jeffrey Gblende
(74) *Attorney, Agent, or Firm* — Greenblum & Bernstein, P.L.C.

(57) ABSTRACT

A method and circuit for controlling the delivery of power having a current component to a load having an inductive component, the method comprising selectively switching power to the load with a switch, wherein the switch is caused to operate at the threshold of saturation during a conduction state such that the switch self commutates to its off state when the magnitude of the current through the load is substantially zero. The method and circuit may be used in a number of applications for detecting a current zero crossing and may be applied to circuits such as dimmer circuits.

11 Claims, 6 Drawing Sheets

CURRENT ZERO CROSSING DETECTOR IN A DIMMER CIRCUIT

TECHNICAL FIELD

This invention relates to dimmer circuits and in particular, to controlling the switching of a dimmer circuit controlling inductive loads.

PRIORITY

This application claims priority from Australian Provisional Patent Application No. 2005906950 entitled "Current Zero Crossing Detector in a Dimmer Circuit", and filed on 12 Dec. 2005.

The entire content of this provisional application is hereby incorporated by reference.

BACKGROUND

Dimmer circuits are used to control the power provided to a load such as a light or electric motor from a power source such as mains. Such circuits often use a technique referred to as phase controlled dimming. This allows power provided to the load to be controlled by varying the amount of time that a switch connecting the load to the power source is conducting during a given cycle.

For example, if voltage provided by the power source can be represented by a sine wave, then maximum power is provided to the load if the switch connecting the load to the power source is on at all times. In this way the, the total energy of the power source is transferred to the load. If the switch is turned off for a portion of each cycle (both positive and negative), then a proportional amount of the sine wave is effectively isolated from the load, thus reducing the average energy provided to the load. For example, if the switch is turned on and off half way through each cycle, then only half of the power will be transferred to the load. Because these types of circuits are often used with resistive loads and not inductive loads, the effect of repeatedly switching on and off power will not be noticeable as the resistive load has an inherent inertia to it. The overall effect will be, for example in the case of a light, a smooth dimming action resulting in the control of the luminosity of the light. This technique will be well understood by the person skilled in the art.

In leading edge dimmer topologies for controlling inductive loads, it is generally necessary to allow the prevailing half-cycle load current to fall to near-zero levels, before returning the switch to the off-state, in order to avoid excessive inductive voltage spiking levels, which can cause damage to the electrical components of the dimmer circuit and the load. Turning off the switch while there is any appreciable level of current causes a sudden rise in the voltage appearing across the load. As described by the well known relationship $V = L * dI/dt$ Where V is the voltage appearing across the inductive load;
L is the magnitude of the inductance of the load; and
dI/dt is the rate of change of the current I through the load over time t
as will be understood by the person skilled in the art.

As can be seen, the greater the rate of change in current I through the load, the greater the voltage spike occurring. It follows then that the greater the current at the time of turning off the switch, which causes the current to fall to zero in a very short space of time, the greater the rate of change of current and therefore the greater the voltage spike induced. Accordingly then, it is desirable to turn off the switch when the magnitude of current is nearly zero.

Several techniques are commonly used to achieve this.

The first is the use of a series current sense resistor with a precision operational amplifier arrangement to determine when the load current falls to sufficiently low levels such that the switch can be turned off with minimal resulting voltage spiking levels. However, since the current sense resistor adds to the total resistance of the dimmer, it results in more power being drained by the dimmer. Accordingly, this approach has some draw backs.

In a second technique, use is made of the MOSFET on-state resistance. In many dimmer circuit arrangements, the switch is constituted by a MOSFET device (Metal-Oxide Semiconductor Field-Effect Transistor). This MOSFET has an internal resistance when in the on state. In a similar manner to the above, a precision op-amp arrangement can be employed to determine the point in time where the MOSFET on-state conduction voltage polarity reverses. This approach however, suffers from the draw back that the timing accuracy of zero crossing detection diminishes for smaller loads.

A third approach is to use non-zero current MOSFET turn-off anyway. For loads that are only marginally inductive (for example, typical iron core based LV lighting) it is possible to turn off the MOSFETs at the point in time corresponding to mains voltage zero-crossing. The stored energy in the transformer leakage inductance can then be allowed to transfer to a suitably sized capacitor in shunt with the dimmer terminals. A decaying ringing dimmer voltage waveform will result, where the initial stored energy is dissipated, over a number of ringing cycles, in the series resistance comprising the transformer loss elements and secondary lamp load. Since the instantaneous mains voltage is relatively low around the zero crossing region, moderate peak ringing voltages can be tolerated. Of course, this approach is only useful for loads that have only a small inductive component, and cannot be used for greater or purely inductive loads.

It is therefore an object of the present invention to provide an alternative method and circuit for reducing the occurrence of voltage spiking when controlling an inductive load or a load having an inductive component.

SUMMARY OF THE INVENTION

According to a first aspect of the present invention, there is provided a method of controlling the delivery of power having a current component to a load having an inductive component, the method including selectively switching power to the load with a switch, wherein the switch is caused to operate at the threshold of saturation during a conduction state such that the switch self commutates to its off state when the magnitude of the current through the load is substantially zero.

In one form, the switch is a MOSFET (Metal-Oxide-Semiconductor Field-Effect Transistor).

In one form, the MOSFET is caused to operate at the threshold of saturation by controlling a biasing voltage applied to the switch.

In one form, the biasing voltage is controlled by comparing a voltage across the MOSFET with a reference voltage and adjusting the biasing voltage to a level to cause the MOSFET to operate at the threshold of saturation when the voltage across the MOSFET falls below the reference voltage.

In one form, the biasing voltage is adjusted to zero upon the MOSFET self-commutating to the non-conducting state.

In one form, the value of the reference voltage is increased up to a maximum reference voltage exponentially.

According to a second aspect of the present invention, there is provided a circuit for controlling the delivery of power having a current component to a load having an inductive component, the circuit comprising a switch and a switch control means for causing the switch to operate at the threshold of saturation during a conduction state such that the switch commutates to its off state when the magnitude of the load current is substantially zero.

In one form, the switch is a MOSFET (Metal-Oxide-Semiconductor Field-Effect Transistor).

In one form, the switch control means is a comparator for comparing a voltage across the MOSFET with a reference voltage, to control a biasing voltage of the MOSFET.

In one form, the comparator is a transistor having the voltage across the MOSFET applied to a first terminal of the transistor, and the reference voltage applied to a base terminal of the transistor.

In one form, the transistor is an npn bipolar transistor and the voltage is applied to an emitter terminal of the npn bipolar transistor. In one form, the reference voltage is produced by a capacitor charging to a maximum value to provide an inverse exponential rise in the reference voltage up to the maximum value.

According to a third aspect of the present invention, there is provided a dimmer circuit for controlling the delivery of power having a current component to a load having an inductive component, wherein the dimmer circuit comprises the circuit arrangement of the second aspect of the present invention.

According to a fourth aspect of the present invention, there is provided a method of detecting a load current zero crossing, the method comprising causing a switch to operate at the threshold of saturation during a conduction state such that the switch will self-commutate to the off state when the load current reaches zero crossing.

According to a fifth aspect of the present invention, there is provided a circuit for detecting a load current zero crossing, the circuit arrangement comprising:
  a switch having an on state, an off state and a saturation state; and
  a switch control means for causing the switch to operate at a threshold of its saturation state during the on state so as to self-commutate into the off-state when the load current reaches zero crossing.

BRIEF DESCRIPTION OF THE DRAWINGS

The invention will now be described in more detail with reference to the following drawings in which.

DETAILED DESCRIPTION

Throughout this specification, the terms "linear mode" and "saturation mode" are used to describe various aspects of the present invention. It will be understood that the term "linear mode", when used in relation to a switch such as a MOSFET, means that the switch exhibits a resistive V/I characteristic, i.e. $V_{DS}=R_{DS} \times I_L$; where $V_{DS}$ is the Drain-Source voltage of the switch, $R_{DS}$ is the Drain-Source resistance and $I_L$ is the load current. It will also be understood that the term "saturation mode" refers to the state in which the $V_{DS}$ of the switch is not a function of current (determined by $V_{GS}$ magnitude, where $V_{GS}$ is the Gate-Source voltage).

Figure 1:
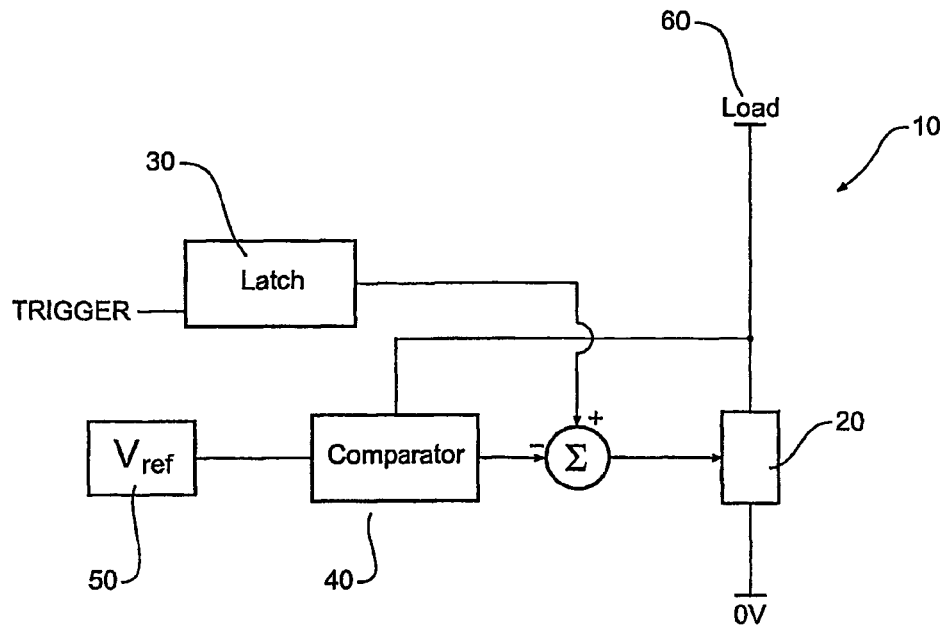
FIG. 1—shows a block diagram of the components of the preferred embodiment of the circuit of the present invention.

FIG. 1 shows a block diagram of an arrangement 10 for controlling power delivered to load 60 by switch 20. A feedback signal $V_{fb}$ proportional to the voltage across the switch 20 is provided to one input of commutation control block 40 (provided by a comparator), which compares this feedback signal with a reference voltage $V_{ref}$ provided by voltage reference block 50. Consider the situation when switch 20 is closed, or in the conducting state, and the load terminal is in the positive half-cycle $V_{fb}$ is proportional to the load current $I_L$ flowing through switch 20 (in fact, is equal to the load current multiplied by the resistance of the switch) and provides a good indication of when this current is approaching zero. According to an aspect of the present invention, when the value of the feedback signal falls below $V_{ref}$, comparator 40 controls switch 20 to cause it to operate in its saturation mode so that when $I_L$ does reach zero, switch 20 automatically self-commutates to its non-conducting state to turn off. Turning off at this stage, when $I_L$ is zero, or substantially zero, results in a minimisation of inductive voltage spikes.

It will be appreciated that the switch used and described in this invention is a MOSFET (Metal-Oxide-Semiconductor Field-Effect Transistor), however, the invention can be applied to any other type of switch (currently in existence or that may yet be developed in the future) that is able to self commutate into an off state when the current through the switch becomes substantially zero. This invention is particularly applicable to MOSFET based dimmer designs as MOSFETs are the only type of power transistor currently capable of conduction in either direction (excluding conduction of intrinsic anti-parallel diode)—thus providing the advantages of lower conduction state losses in AC switch applications. However the principle of this invention can be applied to other power transistor types, such as IGBTs.

As will be explained in more detail below with reference to FIG. 2, the latch circuit 30 will serve to completely remove control voltage at the switch 20 to completely turn switch 20 off.

The latching circuit 30 is reset to allow conduction of the switch in the next positive cycle by applying a trigger pulse to the trigger input when conduction of the switch 20 is next required.

Figure 2:
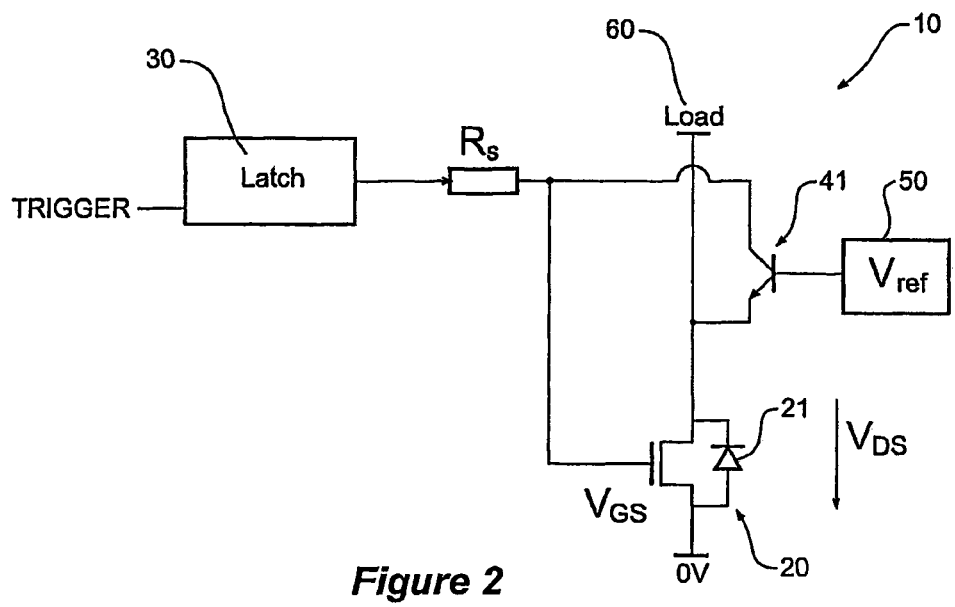
FIG. 2—shows the arrangement of FIG. 1 in more detail.

In FIG. 2, there is shown the arrangement of FIG. 1 in more detail. In this arrangement, the switch control 40 is provided by a comparator, and more specifically, an npn transistor 41. The switch 20 is a MOSFET. MOSFET 20 also has a reverse parallel diode 21 across its Drain/Source terminals.

Transistor 41 in FIG. 2 performs as the comparator (depicted as 40 in FIG. 1), with input from Vref at base b and input from $V_{DS}$ at emitter e, functioning to restrict gate input voltage of MOSFET 20 whenever $V_{DS}$ tends to drop below $V_{ref}$ by an amount corresponding to base-emitter potential of transistor 41.

Figure 3:
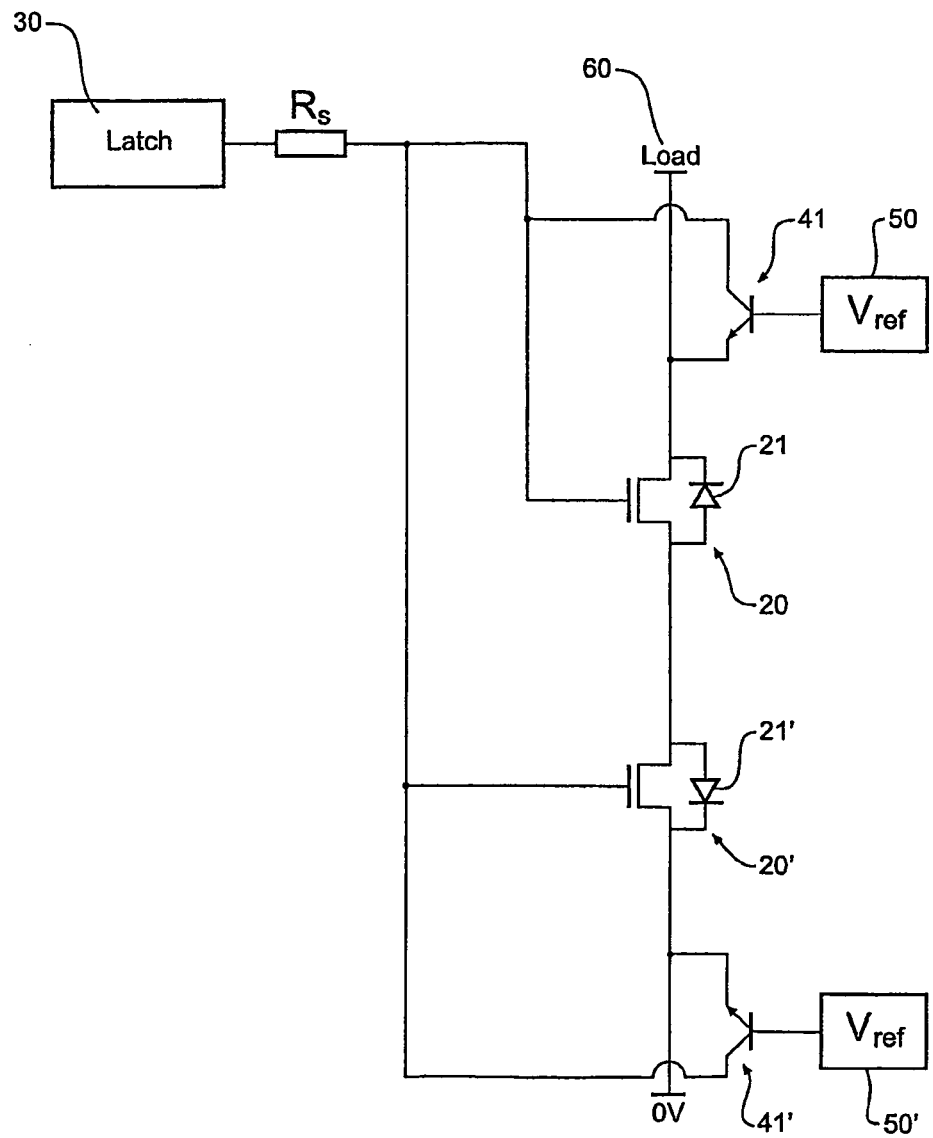
FIG. 3—shows the arrangement of FIG. 2 applied to two switching devices in a dimmer circuit.

In FIG. 3, there is shown the arrangement of FIG. 2 as applied to a dimming circuit arrangement having two MOSFETs 20 and 20'. Each of these switches 20 and 20' have respective switch control blocks (incorporating respective transistors 41 and 41'), as well as respective reference voltage blocks 50 and 50'. In this arrangement, latch circuit 30 controls both MOSFETs 20 and 20'.

As will be described in more detail below, the respective feedback circuits for each MOSFET operate independently, and in fact, need not operate at the same time. The feedback circuit for the MOSFET that is not conducting in a given half cycle is disabled until its respective MOSFET is in conduction.

The arrangement of FIG. 3 may be used in a dimmer circuit application for controlling an inductive load such as a fan. Such a circuit uses one MOSFET for each half cycle of an alternating current (AC) power source as will be understood by the person skilled in the art.

To facilitate understanding of the operation of the arrangement described herein, reference will now be made to FIGS. 4, 5A, 5B, 6A, 6B, 7A, 7B, 8A and 8B, which show waveforms at various points in the arrangement of FIG. 2.

Figure 4:
FIG. 4—shows a waveform of load current.

Turning first to FIG. 4, there is shown a general form of the waveform of load current $I_L$ passing through the load 60, and hence MOSFET current, for a leading edge dimmer at mid-conduction setting. It will be appreciated that FIG. 4 and the following waveform figures only show half-cycles of one polarity. The other polarity is accommodated by an identical independent circuit arrangement as shown in FIG. 3.

Figure 5A:
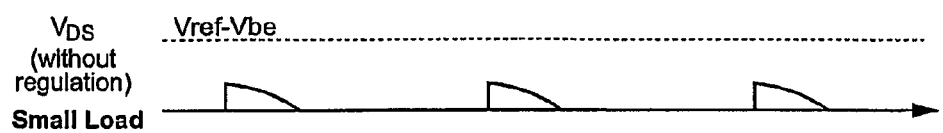
FIG. 5A—shows a corresponding waveform for $V_{DS}$ without regulation for a small load.

FIG. 5A shows the waveform representing resulting voltage, $V_{DS}$, across MOSFET 20, where the load 60 is a relatively small load (for example about 150 W. FIG. 5A shows the waveform if no regulation is applied. Note that $V_{DS}$ does not exceed the target regulated value of 0.5V (in this example), determined by (Vref−Vbe), where Vref=1V & Vbe=0.5V in this particular example.

Figure 5B:
FIG. 5B—shows the waveform of FIG. 5A with regulation.

FIG. 5B shows the waveform of FIG. 5A, however, in this case, showing the effect of the $V_{DS}$ regulation mechanism described above with reference to FIG. 2. In this case, $V_{DS}$ does not fall below $V_{DS}$(reg)=0.5V whenever $I_{DS}$ is non-zero. At the point in time when the load current falls to zero, $V_{DS}$ drops to zero since at this time the driving voltage responsible for the current falls to zero.

Figure 6A:
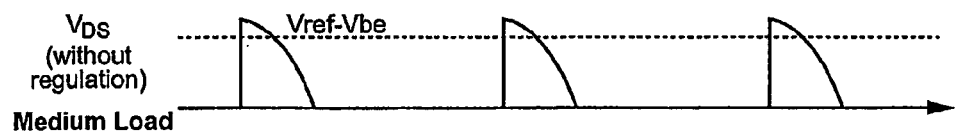
FIG. 6A—shows a corresponding waveform for $V_{DS}$ without regulation for a medium load.

FIG. 6A shows the waveform representing resulting voltage $V_{DS}$ across MOSFET 20, where the load 60 is a medium load (for example, about 700 W), for the situation if no regulation is applied. Note that $V_{DS}$ exceeds the target regulated value of 0.5V for a significant part of the current conduction period.

Figure 6B:
FIG. 6B—shows the waveform of FIG. 6A with regulation.

FIG. 6B shows the waveform of FIG. 6A, however showing the effect of the $V_{DS}$ regulation mechanism ie. minimum value of $V_{DS}$ limited to $V_{DS}$(reg)=0.5V whenever $I_{DS}$ is non-zero. Where instantaneous $V_{DS}$ magnitude exceeds $V_{DS}$(reg) due to product $I_{DS} \times R_{DS}$, no regulation occurs.

Figure 7A:
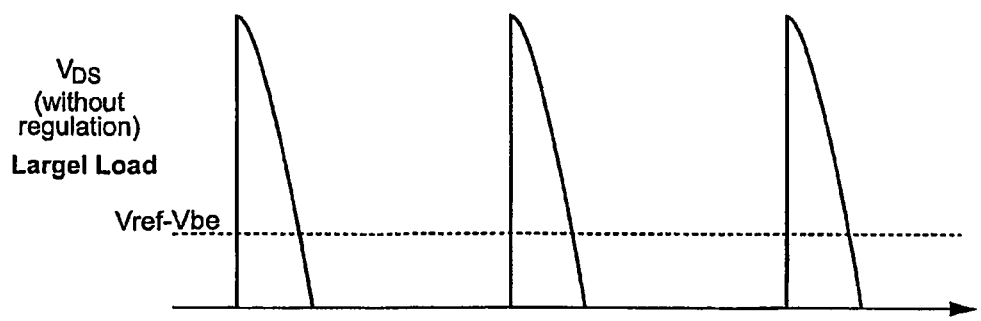
FIG. 7A—shows a corresponding waveform for $V_{DS}$ without regulation for a large load.

FIG. 7A shows the waveform representing resulting voltage $V_{DS}$, across MOSFET 20, where load 60 is a large load (for example about 2400 W for the situation if no regulation is applied. Note that $V_{DS}$ exceeds target regulated value of 0.5V for the majority of the current conduction period.

Figure 7B:
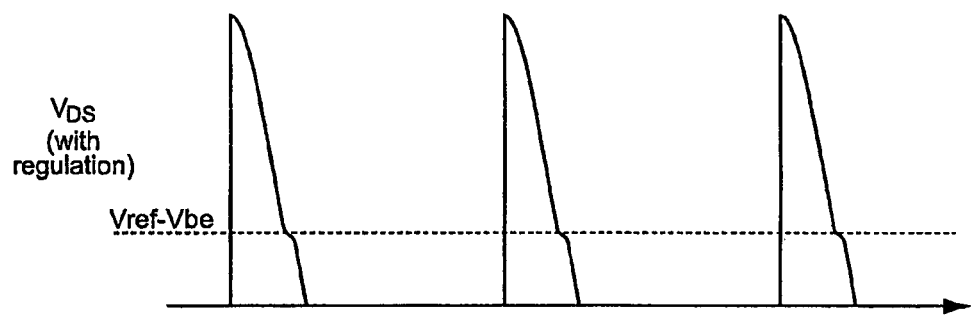
FIG. 7B—shows the waveform of FIG. 7A with regulation.

FIG. 7B shows the waveform of FIG. 7A, however showing the effect of the $V_{DS}$ regulation mechanism ie. minimum value of $V_{DS}$ limited to $V_{DS}$(reg)=0.5V whenever $I_{DS}$ is non-zero. Where instantaneous $V_{DS}$ magnitude exceeds $V_{DS}$(reg) due to product $I_{DS} \times R_{DS}$, no regulation occurs. Note that for increasingly large loads, $V_{DS}$ regulation begins closer to actual zero-current crossing.

Figure 8A:
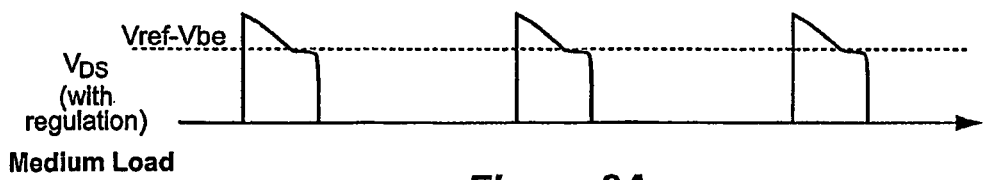
FIG. 8A—shows another corresponding waveform for $V_{DS}$ with regulation for a medium load.

FIG. 8A shows a similar waveform to that of FIG. 6B for a medium load with regulation. MOSFET 20 operates in linear mode for $I_{DS} \times R_{DS} > V_{DS}$(reg)=0.5V, due to application of maximum gate drive voltage. Conversely, MOSFET 20 operates in saturation mode for $I_{DS} \times R_{DS} < V_{DS}$(reg)=0.5V, due to gate drive limiting at turn-on threshold voltage region, $V_{GS}$(th).

Figure 8B:
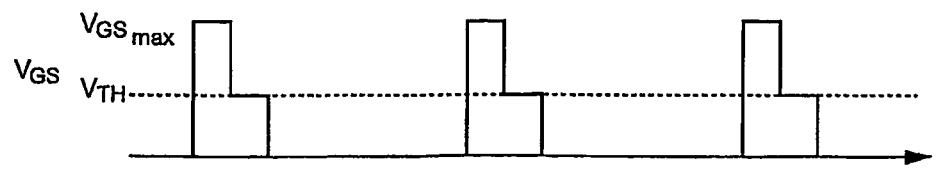
FIG. 8B—shows the waveform of $V_{GS}$ in comparison to the waveform of FIG. 8A.

FIG. 8B shows the waveform of $V_{GS}$ in comparison to $V_{DS}$ of FIG. 8A. During the period where no $V_{DS}$ regulation is applied, applied $V_{DS}$ is $V_{DS}$(max) ie. $V_{GS} \gg V_{GS}$(th). During the period where $V_{DS}$ regulation is applied, applied $V_{GS}$ is limited to the $V_{GS}$(th) region.

The operation of the circuit will now be described in more detail with reference to FIG. 9.

The general operation of the circuit arrangement of the present invention can be separated into two main functional blocks.

1. A resetable driver latch, which when triggered provides gate drive current for the load controlling MOSFETs.

2. Commutation control circuits (one for each line voltage half-cycle polarity), which function to remove gate drive at load zero-current crossing, while simultaneously resetting the latch.

The Driver Latch

In the initial latch reset state, output transistor Q3 is biased into conduction via series resistors R3, R4 and R7. Resistor R9 via Q3 collector holds the latch output at near zero volts, since in this state there is insufficient potential developed across R3 in order to operate transistor Q2.

The latch is set at application of voltage to input resistor R1, by providing current to cause conduction of Q1 collector. The increased current resulting in resistor R4 is then sufficient to allow operation of Q2. Current consequently provided by Q2 collector, through series resistors R5 and R6, is sufficient to maintain operation of Q1 even after input voltage to R1 is removed. Additional current provided by Q2 collector can flow through resistor R8 in order to operate the load controlling power transistors.

The latch can be reset by the action of clamping the output to a voltage level of less than approx. 1V, whereby diode D1 shunts a significant proportion of the latching feedback current supplied by R5.

The Commutation Control

In a selected mains voltage polarity half-cycle, the commutation control circuit applies negative feedback limiting of the minimum positive conduction voltage drop appearing across the forward biased load controlling MOSFET. The opposite, reverse biased MOSFET—where current may flow through the anti-parallel diode, has an associated negative voltage drop and the feedback mechanism is accordingly disabled.

At the end of the half-cycle, where the load current attempts to commutate into the opposite polarity, the prevailing regulated positive conduction voltage drop across the forward biased load controlling MOSFET also commutates to zero.

Consequently, the applied feedback mechanism entirely removes gate drive—ceasing further transistor conduction, whilst simultaneously resetting the driver latch.

The following description applies in the mains half-cycle polarity where the load terminal is positive with respect to the line terminal. The primary function of main component elements are first summarised.

Capacitor C1, in conjunction with voltage divider series elements R10, R11, D7, D8, D2 & Q5 base-emitter develops a reference voltage to be applied to base input of comparator transistor Q4.

Transistor Q4 acts to shunt gate drive supply of output transistor (Q8), if the established C1 reference voltage— minus Q4 base-emitter, D6 anode-cathode and D4 anode-cathode voltages, exceeds the forward conduction voltage of Q8.

Diode D4 serves to block high voltages appearing across the output switching transistor Q8, from being directed to either D6 cathode or Q10 emitter.

C1 reference voltage biasing elements D7, D8, D2 & Q5 base-emitter provide an additional function of temperature compensation for Q4 base-emitter, D6 anode-cathode & D4 anode-cathode operating voltages.

Resistor R12 is added to facilitate selection of nominal C1 reference voltage.

Transistor Q5 also acts to disable feedback mechanism, via clamping of C2 reference voltage, from being applied to output transistor Q9 for this mains half-cycle polarity.

Resistor R18 initially provides current to bias Q5 into conduction at the beginning of the appropriate polarity mains voltage half-cycle.

Resistor R17 maintains bias current for Q5 after output transistor Q8 has commenced conduction.

Resistor R20 is a damping element to prevent parasitic oscillation of Q8—resulting from parallel gate connection with that of Q9.

Additional transistor Q11 is employed to prevent the possibility of conduction of transistor Q6 when voltage drop (negative) across reverse conducting transistor Q9, via associated intrinsic inverse diode, exceeds approximately one volt in magnitude, such as may occur as a consequence of high currents at lamp load start-up. This would otherwise, in the original circuit arrangement presented, result in Q8 gate voltage clamping, therefore current limiting action of Q8 during these events.

Additional diode D9 is placed in series with Q6 emitter terminal, ensuring conduction of Q11 has priority during the condition described above, where there is sufficient negative voltage appearing across Q9.

Resistor R23 is required to limit load current component magnitude flowing through Q11 base-emitter during the condition described above, where there is sufficient negative voltage appearing across Q9.

Additional (optional) resistor R25 may be added for the purposes of minimising induced positive voltage on C2, due to stray parasitic capacitive coupling.

Additional capacitor C4 in conjunction with existing resistor R19, delays operation of Q7 following the load current commutation process, when a positive voltage appears across Q9 corresponding to the presence of the next mains voltage half-cycle of opposite polarity. This is of particular importance for inductive load types, where the rate of reapplied voltage is relatively rapid and immediate operation of Q7 would prematurely terminate the process of proper gate drive cutoff of Q8.

At the start of the mains voltage half-cycle having positive polarity, resistor R18 initially biases transistor Q5 into collector conduction, holding, via resistor R14, reference voltage capacitor C2 in a discharged state. This action effectively disables the feedback mechanism from being applied to the reverse biased MOSFET Q9 for this polarity mains voltage half-cycle, as indicated above.

In this mains voltage half-cycle polarity, resistor R19 cannot supply current for biasing Q7 into conduction, thus reference voltage capacitor C1 is allowed to be partially charged via resistors R10 & R11. With the driver latch initially in the reset state, MOSFETs' Q8 & Q9 gate voltage is held at a near zero volt level. Consequently, the base-collector junction of transistor Q4 is forward biased, and acts to clamp reference voltage across C1 at approx. 0.6V.

Triggering of the driver latch results in application of gate voltage to the transistors Q8 & Q9 and consequent load current conduction. The non-zero gate voltage removes the forward bias condition of Q4 base-collector junction, so that clamping of C1 reference voltage ceases. Current supplied via R10 & R11 then causes the reference voltage across C1 to increase in a near linear fashion, to a level equal to the sum of Q5 base-emitter voltage, series diodes D2, D8 & D7 anode-cathode voltages. The resulting controlled rising reference voltage applied to Q4 base ensures that Q4 collector conduction initially increases in an exponentially decreasing rate of rise, that is, the feedback mechanism is gradually introduced.

The time constant associated with charging of reference voltage across C1 is selected to be greater than the turn-on transition time of the output transistor Q8.

This is necessary so that the negative feedback limiting process can be applied in a gradual fashion, in order to avoid introduction of step changes in rate-of-change of output transistor voltage—as required for minimum EMI components.

Resistor R17 functions to maintain base current drive to Q5, which ceases to be supplied by R18 upon conduction of Q8.

Q8, being a MOSFET, its associated conduction voltage prior to load half-cycle current commutation is normally a direct function of load current magnitude. At smaller loads however, the tendency for Q8 conduction voltage to be negligible is countered by conduction of Q4—acting to limit Q8 gate drive voltage. The minimum conduction voltage of Q8 is thus controlled to a level of approx. 0.6V, determined by C1 reference voltage minus the sum of Q4 base-emitter voltage and D6 & D4 anode-cathode voltages.

At load half-cycle current commutation, Q4 diverts total current supply for Q8 gate input, including charge stored in Q8 input capacitance, to the lower potential appearing at Q8 load terminal. This action simultaneously removes gate drive from Q9 and resets the latch driver, so that Q9 cannot commence conduction immediately following current commutation.

Figure 9:
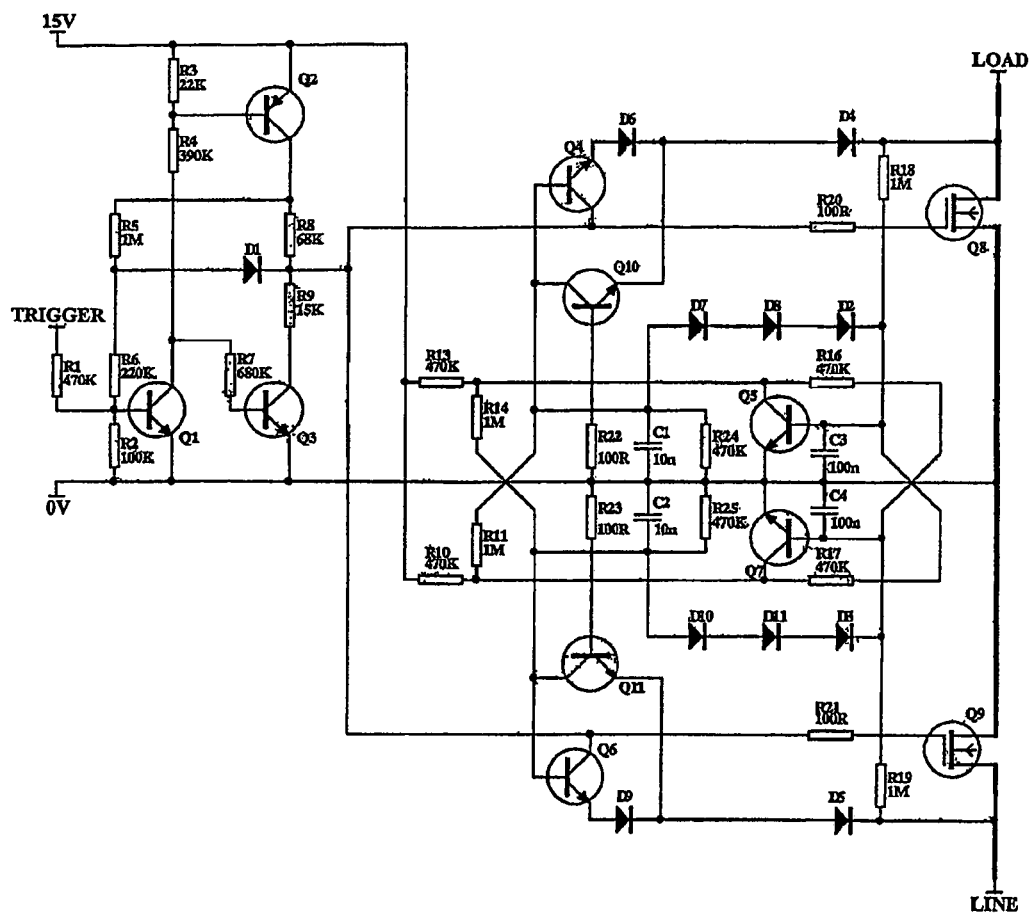
FIG. 9—shows an example circuit configuration for the arrangement of FIG. 3.
Figure 10:
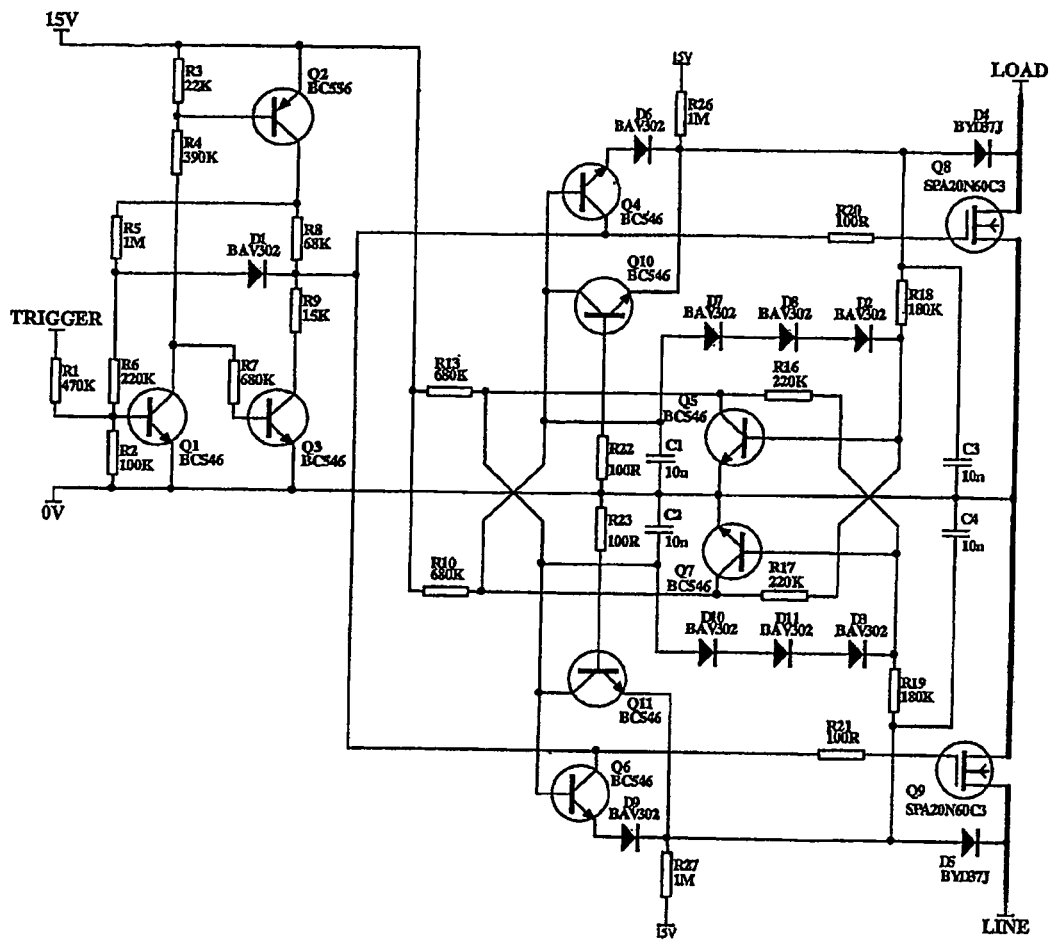
FIG. 10—shows a modified circuit arrangement of the arrangement of FIG. 9.

FIG. 10 shows a modification of the circuit of FIG. 9, in which like elements are accordingly labelled.

The changes between the circuits of FIG. 10 and FIG. 9 are summarised below:

R18 connection changed from D4 cathode to D4 anode.
R18 value changed from 1M to 180K
C3 connection changed from Q5 base to D4 anode.
R26 added from 15V rail to D4 anode.
R24 deleted.
R11 value changed from 1M to 0Ω, hence removed.
R13 value changed from 470K to 680K
R16 value changed from 470K to 220K
R19 connection changed from D5 cathode to D5 anode.
R19 value changed from 1M to 180K
C4 connection changed from Q7 base to D5 anode.
R27 added from 15V rail to D5 anode.
R25 deleted.
R14 value changed from 1M to 0Ω, hence removed.
R10 value changed from 470K to 680K
R17 value changed from 470K to 220K D4 serves to block high voltages appearing across the output switching transistor Q8 from being directed to components D6, Q10, R26, C3 and R18. Resistors R26 and R18 initially provide current to bias Q5 into conduction at beginning of appropriate polarity mains voltage half-cycle. Diode D5 anode is held at a potential slightly below zero volts for the mains voltage half-cycle polarity, thus preventing resistors R27 and R19 from supplying bias current to transistor Q7. Capacitor C4 in conjunction with resistor R27, delays operation of Q7 following the load current commutation process, when a positive voltage appears across Q9 corresponding to the presence of the next mains voltage half-cycle of opposite polarity. This is of particular importance for inductive load types, where the rate of reapplied voltage is relatively rapid and immediate operation of Q7 would prematurely terminate the process of proper gate drive cutoff of Q8.

At the start of the mains voltage half-cycle having positive polarity, resistors R26 and R18 initially bias transistor Q5 into collector conduction, holding reference voltage capacitor C2 in a discharged state. This action effectively disables the feedback mechanism from being applied to the reverse biased power transistor Q9 for this polarity mains voltage half-cycle, as indicated above. In the mains voltage half-cycle polarity, resistor R19 cannot supply current for biasing Q7 into conduction due to the low potential at diode D5 anode, thus reference voltage capacitor C1 is free to be charged via resistor R10.

With the driver latch initially in the reset state, the power transistor Q8 & Q9 gate voltage is held at a near zero volt level. Consequently, the base-collector junction of transistor Q4 is forward biased, and acts to clamp reference voltage across C1 at approx. 0.6V. The remainder of the circuit operates as described in relation to FIG. 9.

In two-wire leading edge MOSFET based dimmer applications there are significant advantages of this precision method of zero current crossing detection arrangement. A much greater margin of stability, when controlling inductive loads, in terms of half-cycle symmetry is achieved. For example, highly inductive neon transformer loads can be dimmed down to extremely low brightness levels, without any flickering effects. Operation will remain completely symmetrical with typical low voltage lighting transformers, even after secondary load becomes disconnected.

It has been demonstrated that even with larger toroidal power transformers, which have very low primary winding resistance combined with high primary inductance and therefore low associated magnetising current, only a relatively low magnitude of DC current component may develop when the secondary becomes unloaded.

It will be appreciated that the above has been described with reference to a particular embodiment however, many variations and modifications may be made within the scope of the present invention.

It will also be understood that throughout this specification, unless the context requires otherwise, the words 'comprise' and 'include' and variations such as 'comprising' and 'including' will be understood to imply the inclusion of a stated integer or group of integers but not the exclusion of any other integer or group of integers.

The reference to any prior art in this specification is not, and should not be taken as, an acknowledgement or any form of suggestion that such prior art forms part of the common general knowledge.

The invention claimed is:

1. A method of operating a switch for controlling the delivery of power having a current component to a load having an inductive component in a phase controlled dimmer circuit to reduce the occurrence of voltage spiking, the method comprising:
    comparing a voltage across the switch that selectively switches power to the load with a reference voltage during a conductive state of the switch; and
    generating a biasing voltage for controlling the switch, wherein the biasing voltage is adjusted to a level to cause the switch to operate in a saturation mode if the voltage across the switch is below the reference voltage, and the switch is caused to automatically commutate to its off state when the current through the load is substantially zero by removing the biasing voltage when the voltage across the switch drops to zero due to the current through the load being substantially zero.

2. A method as claimed in claim 1 wherein the switch is a MOSFET (Metal-Oxide-Semiconductor Field-Effect Transistor).

3. A method as claimed in claim 2 wherein removing the biasing voltage comprises adjusting the biasing voltage to zero.

4. A method as claimed in claim 1 wherein the value of the reference voltage is increased up to a maximum reference voltage exponentially.

5. A circuit for controlling the delivery of power having a current component to a load having an inductive component for use in a phase controlled dimmer circuit to reduce the occurrence of voltage spiking, the circuit comprising:
    a switch and a switch controller for controlling a biasing voltage applied to the switch, wherein the switch controller compares a voltage across the switch with a reference voltage and adjusts the biasing voltage to a level to cause the switch to operate in a saturation mode when the voltage across the switch falls below the reference voltage and the switch is caused to automatically commutate to its off state when the current through the load is substantially zero, by removing the biasing voltage when the voltage across the switch drops to zero due to the current through the load being substantially zero.

6. A circuit as claimed in claim 5 wherein the switch is a MOSFET (Metal-Oxide-Semiconductor Field-Effect Transistor).

7. A circuit as claimed in claim 6 wherein the switch controller is a comparator for comparing a voltage across the MOSFET with a reference voltage, to control the biasing voltage of the MOSFET.

8. A circuit as claimed in claim 7 wherein the comparator is a transistor having the voltage across the MOSFET applied to a first terminal of the transistor, and the reference voltage applied to a base terminal of the transistor.

9. A circuit as claimed in claim 8 wherein the transistor is an npn bipolar transistor and the voltage is applied to an emitter terminal of the npn bipolar transistor.

10. A circuit as claimed in claim 7 wherein the reference voltage is produced by a capacitor charging to a maximum value to provide an inverse exponential rise in the reference voltage up to the maximum value.

11. A method as claimed in claim 1, wherein when the voltage across the switch exceeds the reference voltage during a conductive state of the switch, the biasing voltage applied to the switch becomes proportional to the voltage across the switch to cause the switch to operate in a linear mode.

* * * * *